(12) United States Patent
Ueyanagi et al.

(10) Patent No.: US 6,771,589 B2
(45) Date of Patent: Aug. 3, 2004

(54) FLYING RECORDING HEAD HAVING SEMICONDUCTOR LASER FORMED BY GROWING SEMICONDUCTOR CRYSTAL, AND METHOD OF MANUFACTURING SAME

(75) Inventors: Kiichi Ueyanagi, Nakai-machi (JP); Takashi Ozawa, Nakai-machi (JP)

(73) Assignee: Fuji Xerox Co., Ltd., Tokyo (JP)

( * ) Notice: Subject to any disclaimer, the term of this patent is extended or adjusted under 35 U.S.C. 154(b) by 387 days.

(21) Appl. No.: 09/852,327

(22) Filed: May 10, 2001

(65) Prior Publication Data

US 2001/0040868 A1 Nov. 15, 2001

(30) Foreign Application Priority Data

May 10, 2000 (JP) ........................................ 2000-136905

(51) Int. Cl.[7] .............................................. G11B 11/03
(52) U.S. Cl. ....................................................... 369/300
(58) Field of Search .......................... 369/300; 360/123, 360/114.01, 114.02

(56) References Cited

U.S. PATENT DOCUMENTS

| | | | | |
|---|---|---|---|---|
| 5,124,961 A | * | 6/1992 | Yamaguchi et al. | 369/300 |
| 5,325,244 A | * | 6/1994 | Takano et al. | 360/77.03 |
| 6,636,460 B2 | * | 10/2003 | Akiyama et al. | 369/13.14 |

OTHER PUBLICATIONS

Afshin Partovi; *Optical Near–Field Aperture Storage Technique (Onfast) for High Density, High Performance Data Storage Applications*; Joint International Symposium on Optical Memory and Optical Data Storage; SPIE vol. 3864, pp. 352–354; Jul. 1999.

* cited by examiner

Primary Examiner—George J. Letscher
(74) Attorney, Agent, or Firm—Oliff & Berridge, PLC

(57) ABSTRACT

A small, high-precision, and cheap flying recording head having high mass-productivity, high recording density, and high transfer rate, a disk drive, and a method of manufacturing the flying recording head are disclosed. The flying recording head is manufactured by forming a semiconductor laser oscillation region by growing a semiconductor crystal on a rear end surface of a substrate made of a single crystal such as sapphire, and forming a air bearing surface in an output surface of the semiconductor laser and the substrate.

26 Claims, 16 Drawing Sheets

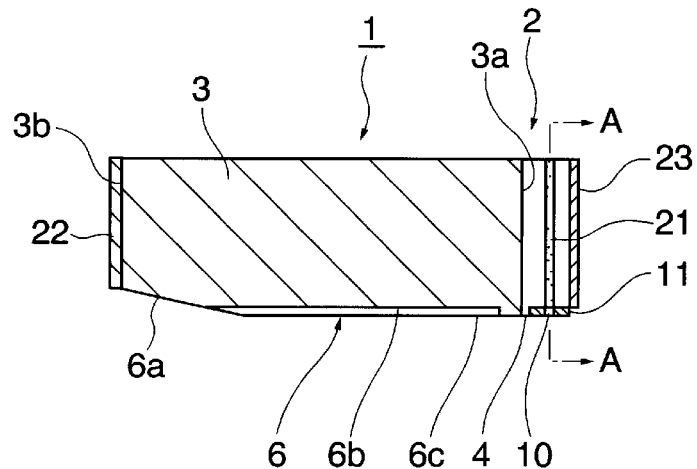
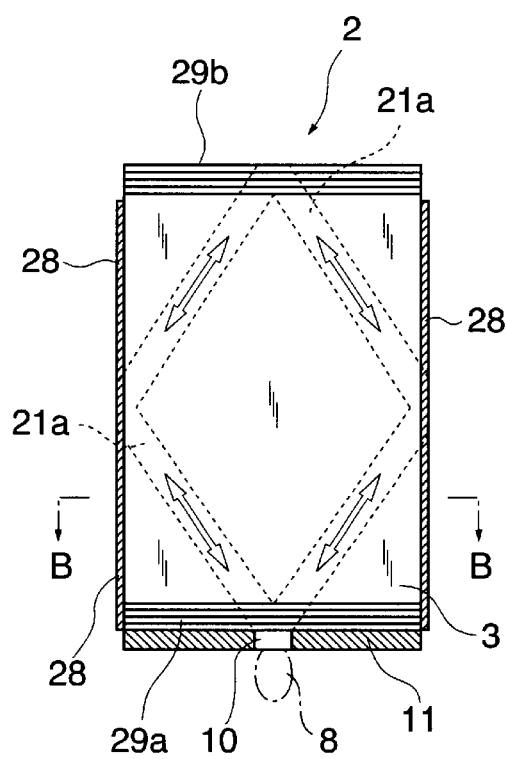
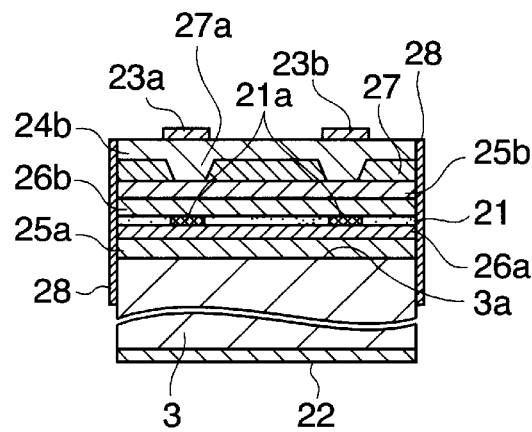
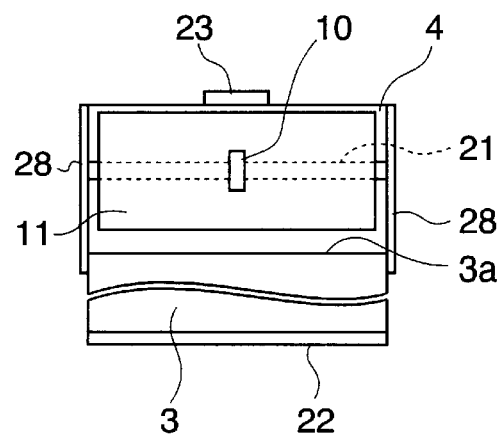

FLYING RECORDING HEAD HAVING SEMICONDUCTOR LASER FORMED BY GROWING SEMICONDUCTOR CRYSTAL, AND METHOD OF MANUFACTURING SAME

BACKGROUND OF THE INVENTION

1. Field of the Invention

The present invention relates to a flying recording head for recording information onto a recording medium such as an optical recording film, a magnetooptic recording film, or a magnetic recording film, a disk drive, and a method of manufacturing the flying recording head. More particularly, a flying recording head which is cheap, small, and highly precise, having high mass-productivity, high recording density, and high transfer rate, a disk drive, and a method of manufacturing the flying recording head.

2. Description of the Related Art

For example, a conventional flying recording head has been disclosed by A. Partovi in "Tech. Dig. ISOM/ODS '99, ThC-1 (1999), p. 352".

FIG. 16 shows the conventional flying recording head. This flying recording head 1 is made of alumina ($Al_2O_3$) and in which an edge emitting type semiconductor laser 200 is bonded to a rear end 100a of a flying slider 100 having a slider surface 100b. In the edge emitting type semiconductor laser 200, a high-reflective multilayer film 201 and a low-reflective multilayer film 202 constructing a resonator for laser having an oscillation wavelength of 980 nm are disposed on the rear end surface and the front end surface of an oscillation region 203, respectively. On the surface of the low-reflective multilayer film 202, a metal shading film 204 in which a micro-aperture 204a is formed by etching using a focused ion beam (FIB) of Ga ions is disposed. In such a configuration, by irradiating a phase-change recording medium 7a of an optical disk 7 with a laser beam 8 of a small size emitted through the micro-aperture 204a, recording and reproduction is performed. At the time of reproduction, reflected light from the recording medium 7a reenters the resonator for laser of the semiconductor laser 200 through the micro-aperture 204a. By a self coupling effect, specifically, by electrically or optically detecting modulation of the semiconductor laser 200 due to the re-incident light, information is reproduced. By using the laser beam 8 of which size is reduced by the micro-aperture 204a for recording/reproducing information, higher recording density can be realized.

In the conventional flying recording head, however, the flying slider 100 and the semiconductor laser 200 are separately manufactured and are adhered to each other. It is, therefore, difficult to perform positioning of the flying slider 100 and the semiconductor laser 200 with high precision. The adhering process causes low mass-productivity and high cost. Since the slider surface 100b formed in the flying slider 100 requires a predetermined area to generate a predetermined flying power, miniaturization is limited.

SUMMARY OF THE INVENTION

The present invention provides a small, high-precision, and cheap flying recording head having high mass-productivity, high recording density, and high transfer rate, a disk drive, and a method of manufacturing the flying recording head.

The invention provides a flying recording head which flies on an airflow generated by rotation of a disk, including: a substrate; a semiconductor laser formed by growing a semiconductor crystal on the substrate; and a slider surface formed on a surface of at least one of the substrate and the semiconductor laser facing the disk.

According to the configuration, the substrate, the semiconductor laser, and the slider surface are integrated, so that the high-precision, small flying recording head having high mass-productivity can be manufactured. As the substrate, an insulating substrate made of sapphire, alumina containing titanium oxide, gallium nitride, silicon nitride, spinel, MgO, or the like or a conductive substrate made of GaN, SiN, Si, GaAs, or the like may be used. As the semiconductor laser, an edge emitting type semiconductor laser or a surface emitting type semiconductor laser (especially a vertical cavity surface emitting laser: VCSEL) may be used. An AlGaInN-based semiconductor crystal may be used for the semiconductor laser. The semiconductor laser may be formed in a surface on the downstream side of an airflow of the substrate (rear end surface), a surface facing a disk (under surface), or a surface opposite to a disk (top surface).

The invention provides a flying recording head which flies on an airflow generated by rotation of a disk, including: a substrate; a semiconductor laser formed by growing a semiconductor crystal on a downstream side surface of the airflow of the substrate; and a slider surface formed on a surface of at least one of the substrate and the semiconductor laser facing the disk.

According to the configuration, the substrate, the semiconductor laser formed in the surface (rear end surface) on the downstream side of the airflow of the substrate, and the slider surface are integrated, so that the high-precision, small flying recording head having high mass-productivity can be manufactured.

The invention provides a flying recording head which flies on an airflow generated by rotation of a disk, including: a substrate; a surface emitting type semiconductor laser formed by growing a semiconductor crystal on a surface of the substrate facing the disk; and a slider surface formed on a surface of at least one of the substrate and the surface emitting type semiconductor laser facing the disk.

According to the configuration, the substrate, the semiconductor laser formed in the surface (under surface) facing a disk of the substrate, and the slider surface are integrated, so that the high-precision, small flying recording head having high mass-productivity can be manufactured.

The present invention provides a flying recording head which flies by an airflow generated by rotation of a disk, including: a transparent substrate; a slider surface formed on a surface facing the disk of the substrate; and a semiconductor laser which is formed by growing a semiconductor crystal on a surface of the substrate opposite to the slider surface and emits a laser beam through the substrate.

According to the configuration, the substrate, the semiconductor laser formed in the surface of the substrate (top surface) opposite to a disk, and the slider surface are integrated, so that the high-precision, small flying recording head having high mass-productivity can be manufactured.

The invention provides a disk drive including: a disk having a surface on which a recording medium is formed; a motor which rotates the disk; a flying recording head having a semiconductor laser formed by growing a semiconductor crystal on a substrate and a slider surface formed on a surface of at least the substrate or the semiconductor laser facing the disk; and a moving unit which relatively moves the flying recording head with respect to the disk.

According to the configuration, the substrate, the semiconductor laser, and the slider surface are integrated, so that the high-precision, small flying recording head having high mass-productivity can be manufactured and low cost, high recording density, and high transfer rate can be accordingly achieved. As a recording medium, an optical recording film, a magneto-optic recording film, a magnetic recording film, or the like can be used.

The invention provides a method of manufacturing a flying recording head including the steps of: forming a semiconductor laser by growing a semiconductor crystal on a substrate; and forming a slider surface at least on the substrate or the semiconductor laser.

According to the configuration, the substrate, the semiconductor laser, and the slider surface are integrated, so that the high-precision, small flying recording head having high mass-productivity can be manufactured.

The invention provides a method of manufacturing plural flying recording heads each having a substrate, a semiconductor laser, and a slider surface, including the steps of: forming plural semiconductor lasers by growing a semiconductor crystal on the substrate; forming the slider surface at least on a surface of the substrate or the semiconductor laser; and dicing the substrate.

According to the configuration, the plural flying recording heads are manufactured by forming the plural semiconductor lasers on the substrate, forming the slider surface and, after that, dicing the substrate, thereby improving the mass-productivity.

BRIEF DESCRIPTION OF THE DRAWINGS

Preferred embodiments of the present invention will be described in detail based on the followings, wherein:

FIG. 7A is a cross section of an essential portion of a flying recording head according to a fourth embodiment of the invention, FIG. 7B is a cross section taken along line A—A of FIG. 7A, FIG. 7C is a cross section taken along line B—B of FIG. 7B, and FIG. 7D is a view showing a light output surface of a semiconductor laser oscillation region;

DETAILED DESCRIPTION OF THE PREFERRED EMBODIMENTS

Figure 1A:
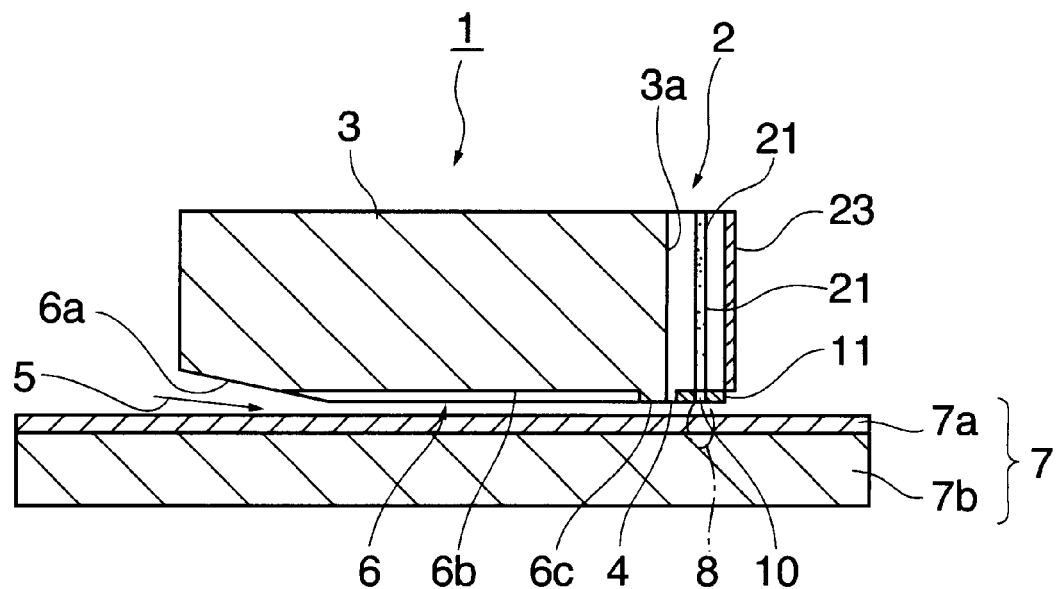
FIGS. 1A and 1B are cross section and bottom view of an essential portion of a flying recording head according to a first embodiment of the invention.
Figure 1B:
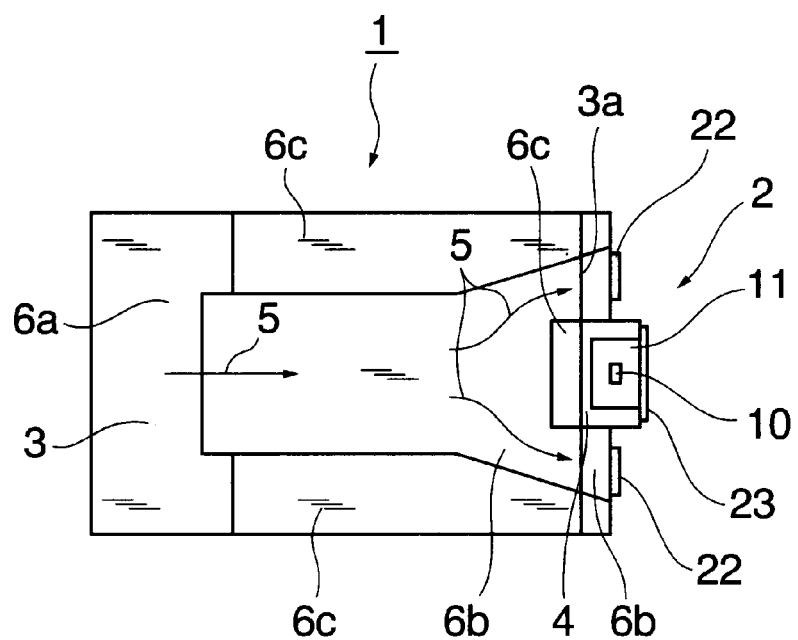

FIGS. 1A and 1B are cross section and bottom view, respectively, of an essential portion of a flying recording head according to a first embodiment of the invention. A flying recording head 1 according to the first embodiment has a substrate 3 of single crystal such as sapphire ($Al_2O_3$), a semiconductor laser oscillation region 2 formed by growing a semiconductor crystal on a surface on the downstream side of an airflow 5 of the substrate 3, that is, a rear end surface 3a, a light output surface 4 of the semiconductor laser oscillation region 2, and a slider 6 formed in a surface (bottom surface) facing an optical disk 7 of the substrate 3.

The semiconductor laser oscillation region 2 takes the form of an edge emitting type laser and has an active layer 21 disposed perpendicular to a recording medium 7a on a substrate 7b of the optical disk 7, a light shading body 11 made of Ag having an aperture 10 for reducing the size of a laser beam 8 in the output region of the active layer 21, a cathode 22, and an anode 23.

The slider surface 6 is constructed by an inclined surface 6a at the tip, a recess 6b formed on the under surface of the substrate 3, and a projection 6c formed on the light output surface 4 of the semiconductor laser oscillation region 2. The projection 6c and the recess 6b travel over the layer of air flowed from the inclined surface 6a and generate a positive pressure and a negative pressure, respectively, thereby enabling flying travel at an appropriate fly height to be realized.

Figure 2A:
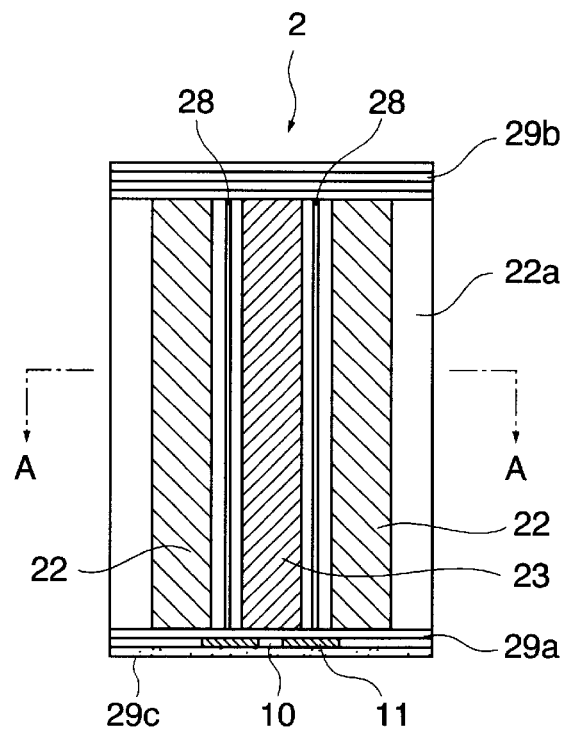
FIG. 2A is a diagram of an essential portion of a semiconductor laser oscillation portion according to the first embodiment.
Figure 2B:
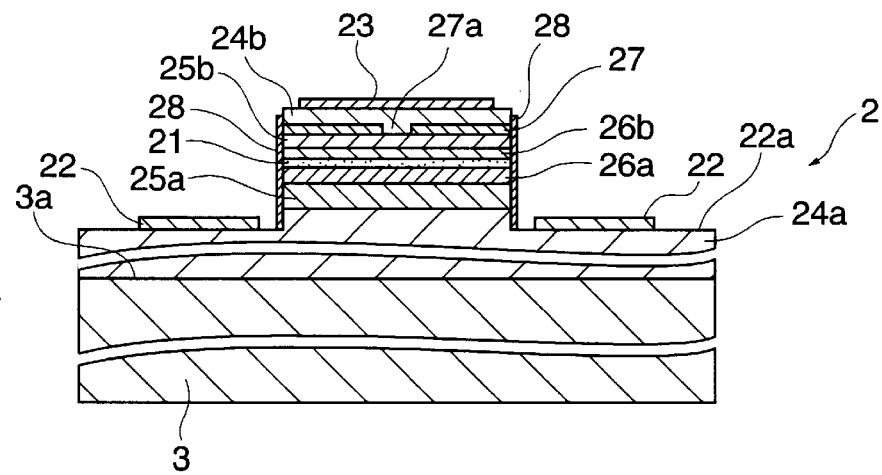
FIG. 2B is a cross section taken along line A—A of FIG. 2A.

FIG. 2A is a diagram of an essential portion of the semiconductor laser oscillation region 2 and FIG. 2B is a cross section taken along line AA. As shown in FIG. 2B, the semiconductor laser oscillation region 2 has a structure in which an AlGaInN-based semiconductor for emitting blue light (having a wavelength of 400 nm) is stacked on the substrate 3 made of sapphire ($Al_2O_3$). Specifically, the semiconductor laser oscillation unit 2 has the substrate 3, the following layers stacked on the substrate 3 via a GaN buffer layer (not shown), which are an n-type GaN contact layer 24a, an n-type AlGaN cladding layer 25a, an n-type guide layer 26a, an InGaN active layer 21, a p-type AlGaN guide layer 26b, a p-type AlGaN cladding layer 25b, and a p-type InGaN current narrowing layer 27, a slit 27a having a width of about 5 μm defining a current region formed in the n-type InGaN current narrowing layer 27, a p-type contact layer 24b stacked on the n-type InGaN current narrowing layer 27 in which the slit 27a is formed, the cathode 22, the anode 23, a side surface protective film 28 made of a dielectric such as SiO$_2$ formed on the side surfaces of the epitaxial layers (24a, 25a, 26a, 21, 26b, 25b, 27, and 24b), a dielectric multilayer film 29a having a relatively low reflectance of 20 to 30% formed on the light output surface 4 side, a dielectric multilayer film 29b formed on the rear end surface opposite to the light output surface 4 and having a high reflectance of 90% or higher constructing the resonator for laser with the dielectric multilayer film 29a, the light shading body 11 having the aperture 10 buried in the dielectric multilayer film 29a, and a protective film 29c made of SiO$_2$ or the like also serving as an antireflection film formed on the aperture 10 and the light shading body 11.

As the material of the light shading body 11, a metal having a high reflectance such as Ag is suitable. The invention, however, is not limited to the metal but a metal such as Ti, W, Mo, Al or a semiconductor having a narrow band gap such as Si can also be used. In the case of using the semiconductor such as Si, to make a film thin (100 nm or less), it is desirable to increase an absorption coefficient by increasing n-type carriers by doping an n-type impurity of high concentration (desirably $10^{20}$ cm$^{-2}$ or higher). Preferably, when the aperture 10 is filled with a TiO$_2$ film having a high refractive index, the laser wavelength becomes shorter in the aperture 10, so that the laser radiation efficiency can be increased. By forming the protective film 29c on the aperture 10 and the light shading body 11, a metal such as Ag which is easily oxidized can be stably used as the material of the light shading body 11. The surfaces are formed so as to be flush with the projection 6c and serve as an slider surface.

Figure 2C:
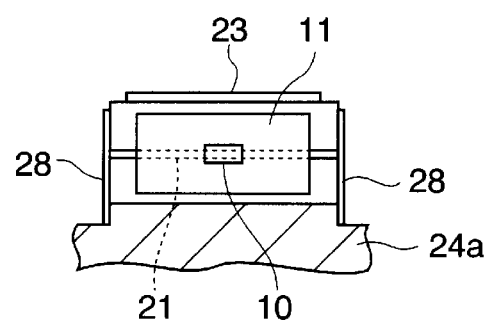
FIG. 2C is a view seen from a light output surface side.

The aperture 10 has, as shown in FIG. 2C, a rectangular shape which is long in the direction of the active layer 21 and is short in the direction perpendicular to the active layer 21 direction. The both sides of the aperture 10 are formed to be shorter than the wavelength of the laser beam. The active layer 21 is formed in a direction transverse tracks (not shown) of the optical disk 7. The length of a record mark (not shown) formed by irradiation of the laser beam on a track is determined by the length in the direction perpendicular to the active layer 21 of the aperture 10. By shortening the length in this direction of the aperture 10, the linear recording density can be increased. By using the rectangular shape, recording marks can be formed without a gap on the tracks, so that the degree of modulation of reflected light at the time of reproduction can be increased.

An example of the method of fabricating the semiconductor laser oscillation region 2 will now be described. First, the n-type GaN contact layer 24a, n-type AlGaN cladding layer 25a, n-type guide layer 26a, InGaN active layer 21, p-type AlGaN guide layer 26b, p-type AlGaN cladding layer 25b, and p-type InGaN current narrowing layer 27 are grown via the GaN buffer layer (not shown) on the wafer-shaped substrate 3 made of sapphire. The slit 27a having a width of about 5 μm defining the current region is formed in the n-type InGaN current narrowing layer 27 by etching and, further, the p-type contact layer 24b is stacked. After growing the crystal, a cathode contact surface 22a is exposed by etching, and the cathode 22 and the anode 23 are formed by an ordinary process such as sputtering, patterning, and alloying. The thickness of the epitaxial layer from the n-type cladding layer 25a to the p-type contact layer 24b is about 2 μm, and a step between the electrodes 22 and 23 is about the same. On the edge of the epitaxial layer (24a, 25a, 26a, 21, 26b, 25b, 27, and 24b), the edge protective film 28 made of dielectric material such as SiO$_2$ is formed.

Figure 3A:
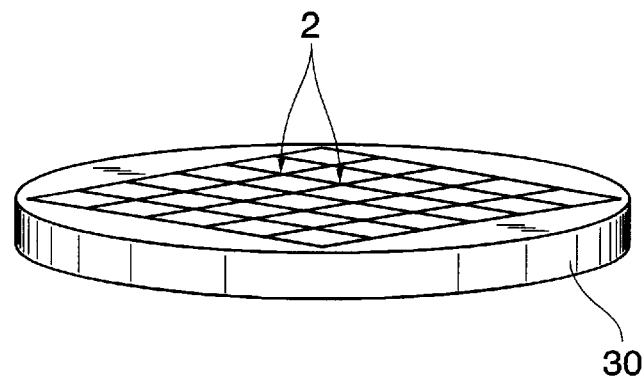
FIGS. 3A and 3B are diagrams showing a method of manufacturing a flying recording head according to the first embodiment.
Figure 3B:
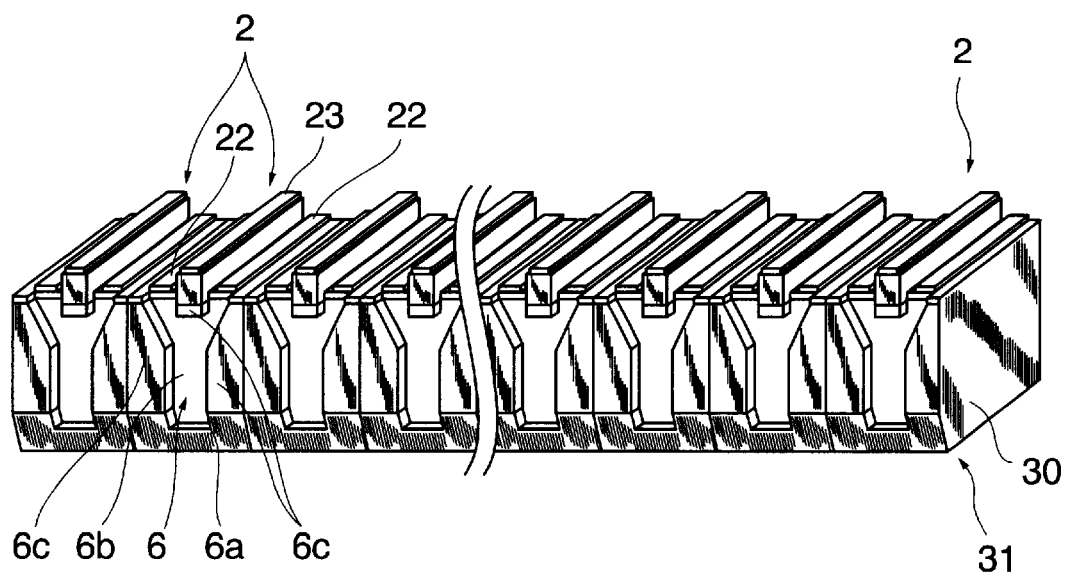

FIGS. 3A and 3B show a case where plural flying recording heads 1 are manufactured simultaneously. As shown in FIG. 3A, plural semiconductor laser oscillation regions 2 are formed in a two-dimensional array on a wafer 30 made of sapphire. After forming the electrodes 22 and 23, the wafer 30 made of sapphire is diced by cleavage or the like into bars 31 each having a predetermined length (about 300 μm) necessary for laser oscillation. The bar 31 is a one-dimensional array of the semiconductor laser oscillation regions 2 as shown in FIG. 3B. As shown in FIGS. 1A and 1B, the portions each corresponding to the recess 6b in the side surface of the bar 31 are removed by etching and the inclined surface 6a is ground, thereby forming plural slider surfaces 6 in the side surface of the bar 31. After that, as shown in FIG. 2A, the dielectric multilayers 29a and 29b made of TiO$_2$/SiO$_2$ or the like for resonator are formed by sputtering. Further, the light shading body 11 made of Ag having the aperture 10 is formed so as to be buried in the dielectric multilayer film 29a.

As specifically described above, according to the first embodiment, only by the process used to fabricate the semiconductor laser and the flying type magnetic head, the flying recording head for recording information to the optical disk 7 can be fabricated. Consequently, only by the conventional process or by slightly modifying the conventional process, mass production can be realized, and a cheap flying recording head can be fabricated. Since the slider surface 6 and the semiconductor laser oscillation region 2 can be integrally formed, high-precision positioning of the slider surface 6 and the semiconductor oscillation region 2 can be realized. Since the slider surface 6 is formed in the substrate 3, the flying recording head as small as the semiconductor laser can be achieved.

In the case of an edge emitting type laser, a cleavage surface serves as a laser beam output surface. Consequently, the substrate and the light output surface coincide with each other at an atomic layer level. By forming the slider surface in the substrate, therefore, the level of the light output surface and that of the slider surface can be matched with each other with high precision.

Although the slider surface 6 is processed before the formation of the dielectric multilayer film 29a and the light shading body 11 in the foregoing embodiment, it can be processed after the formation. It is also possible to form the projection 6c by sputtering and the projection 6c can also be formed by the dielectric multilayer film 29a, thereby enabling the process to be simplified.

Although sapphire is used for the substrate 3 in the foregoing embodiment, an insulating substrate made of spinel or MgO or a conductive substrate made of GaN, SiN, Si, or GaAs can also be used and similar effects can be obtained. In the case of using Si or GaAs for the substrate, not only a crystal of GaN but also an infrared ray of GaAlAs or AlGaInP or a laser beam of red light emission can be used. In the case of using such a substrate, since the substrate is softer than that made of sapphire, GaN or the like, preferably, the slider surface 6 is formed by a thin film made of TiO$_2$, SiN, SiO$_2$, or the like.

FIGS. 4A to 4D show modifications of the semiconductor laser oscillation regions 2. In the semiconductor laser oscillation region 2 shown in FIG. 4A, the anode near the light output surface 4 is divided into right and left anodes 23b and 23a, and a current is split and applied to the anodes 23b and

23a. By the configuration, scanning can be performed in the lateral direction at high speed by the output laser beam 8. High-speed tracking can be realized by using the scanning of the output laser beam 8.

Figure 4A:
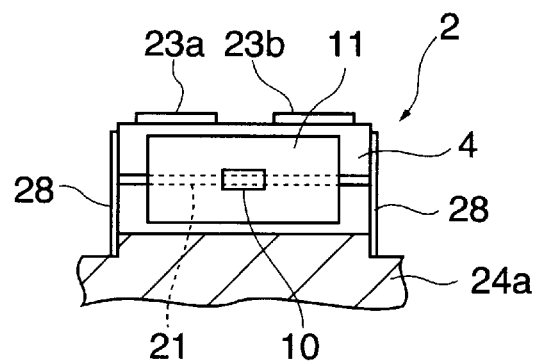
FIGS. 4A to 4D are diagrams showing modifications of the flying recording head according to the first embodiment.
Figure 4B:
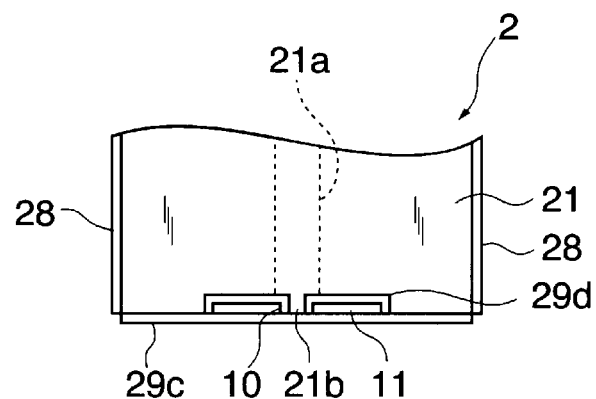

In the semiconductor laser oscillation region 2 shown in FIG. 4B, a cleavage surface of the semiconductor crystal is etched and removed, and the light shading body 11 made of Ag and having the aperture 10 is formed in the removed portion via an insulating film 29d made of SiN, and the aperture 10 is filled with a filling 21b made of InGaN and AlGaN as a semiconductor used to form the active layer 21 and the cladding layer. Consequently, the wavelength of the laser beam in the aperture 10 is further shortened, so that the light radiation efficiency can be raised.

Figure 4C:
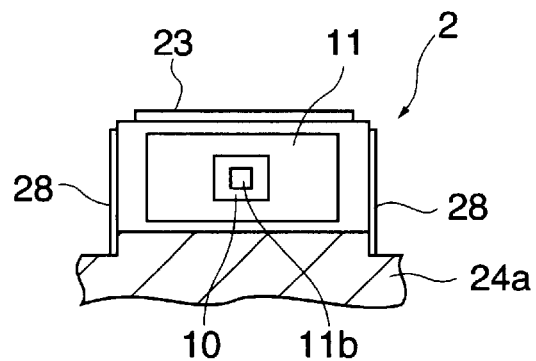
Figure 4D:
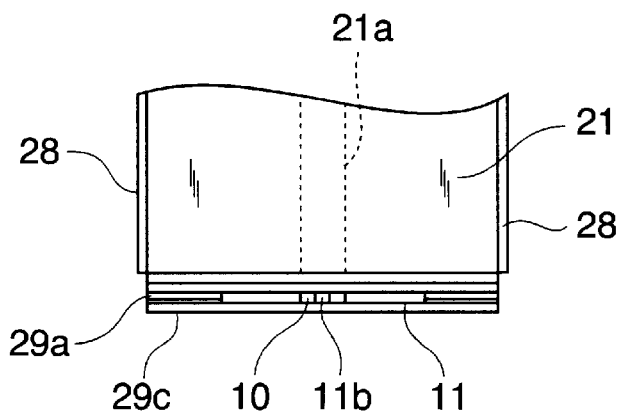

In the semiconductor laser oscillation region 2 shown in FIGS. 4C and 4D, a micro-metal body 11b is disposed in the aperture 10. The size of the micro-metal body 11b is about one third of the aperture 10 or smaller. As the micro-metal body 11b, a metal having a high reflectance such as Ag is suitable. The micro-metal body 11b is not limited to Ag but a metal such as Ti, W, Mo, or Al, or a semiconductor such as Si can also be used. By covering the metal with the protective film 29c also serving as an antireflection film, a metal apt to be oxidized can also be used. In the case of using a semiconductor such as Si, in a manner similar to the case of using the semiconductor for the light shading body 11, it is desirable to increase the carrier concentration by doping an n-type impurity of high concentration. By increasing the carrier concentration, plasmon excitation or increase in probability of light scattering can be achieved. By the above formation, the aperture 10 does cut off the laser beam, so that the laser beam can be emitted efficiently. Because of the micro-metal body 11b, effects such that the laser beam is scattered and the plasmon excited in the micro-metal body 11b generates near-field light are also produced, so that stronger irradiation light can be generated.

Figure 5A:
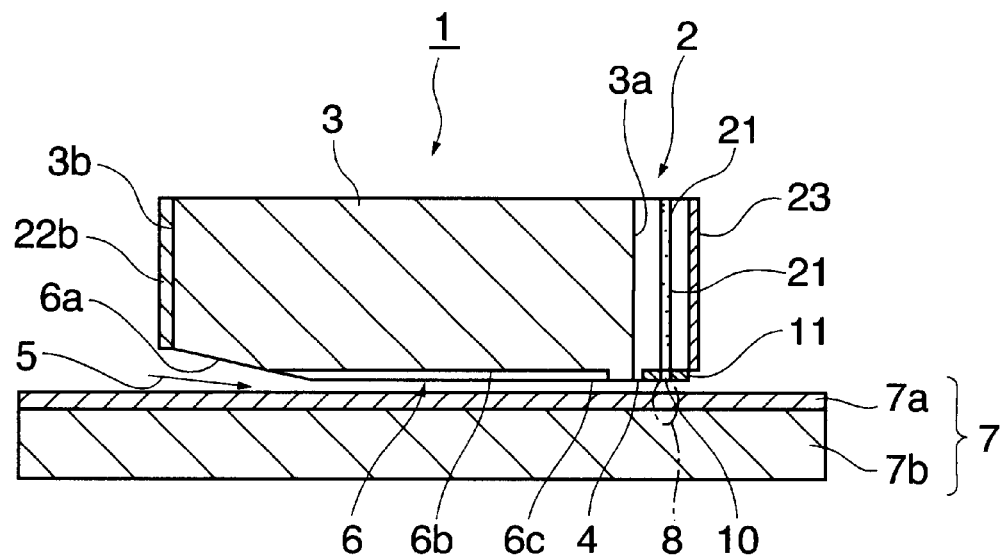
FIG. 5A is a cross section of an essential portion of a flying recording head according to a second embodiment of the invention.
Figure 5B:
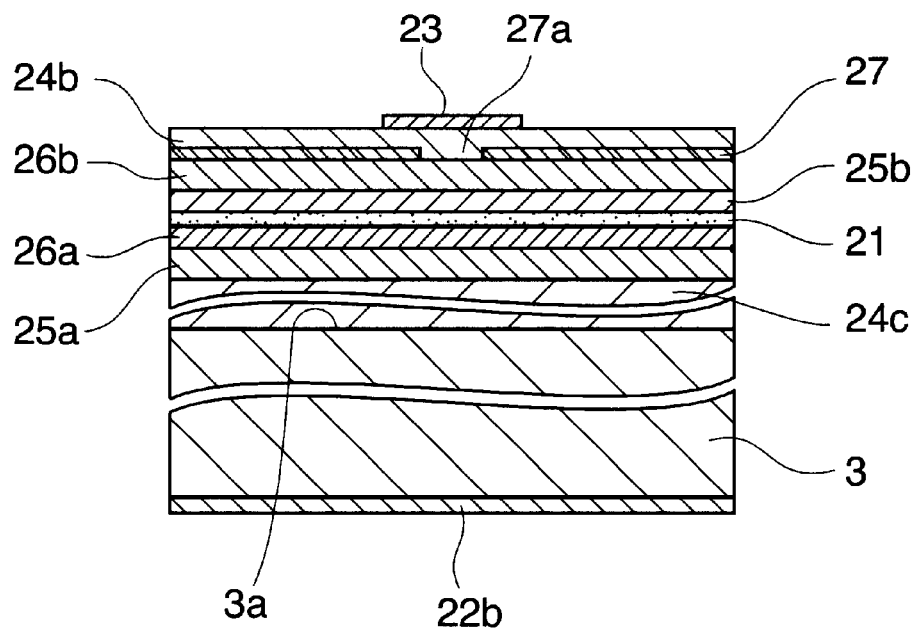
FIG. 5B is a cross section of a semiconductor laser oscillation region.

FIG. 5A is a cross section of an essential portion of a flying recording head according to a second embodiment of the invention, and FIG. 5B is a cross section of the semiconductor laser oscillation region 2. The flying recording head 1 of the second embodiment is constructed in a manner similar to the first embodiment except that GaN crystal having n-type conductivity is used as the substrate 3 and a cathode 22b is formed on a surface opposite to the semiconductor laser oscillation region 2 of the substrate 3, that is, on a front end surface 3b.

The flying recording head 1 constructed as described above is formed in such a manner that, as shown in FIG. 5B, layers from the n-type AlGaN cladding layer 25a to the p-type GaN contact layer 24b are grown in a manner similar to the first embodiment on the rear end surface 3a of the n-type GaN substrate 3 via the n-type GaN buffer layer 24c, the electrodes 23 and 22b are formed, and after that cleavage is performed, thereby forming a slider surface (not shown) in a manner similar to the first embodiment.

As described above, according to the second embodiment, effects similar to those of the first embodiment can be obtained. Moreover, since there is no projection from the slider surface of the semiconductor laser oscillation region 2, the head has an advantage such that the fly height can be more easily adjusted. The etching for the cathode contact surface 22a shown in FIG. 2B can be made unnecessary, so that the structure can be simplified. The formation of the slider surface 6 and the aperture 10 is similar to the first embodiment and effects similar to those of the first embodiment can be obtained.

Figure 6A:
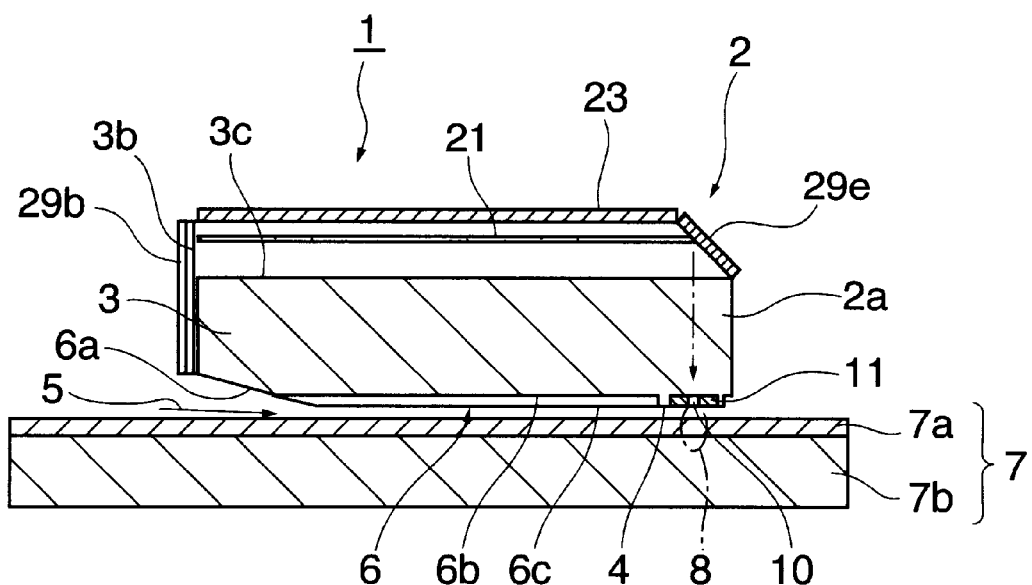
FIGS. 6A and 6B are cross section and bottom view of an essential portion of a flying recording head according to a third embodiment of the invention.
Figure 6B:
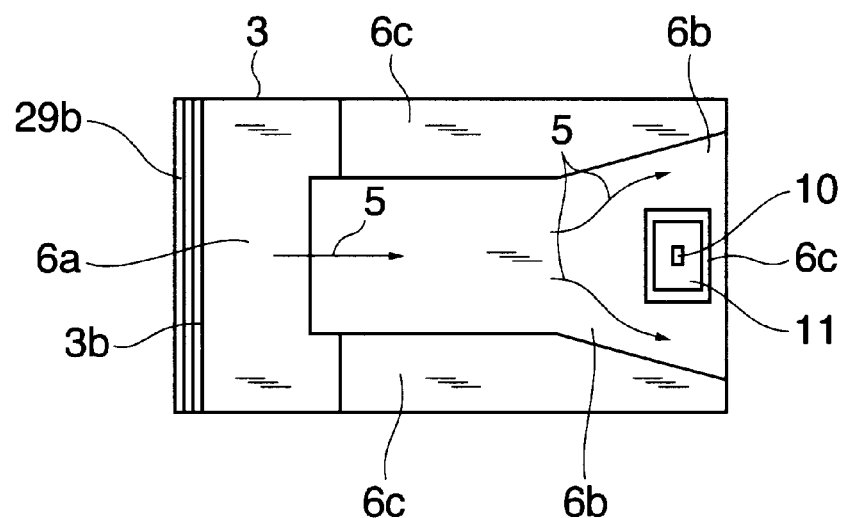

FIGS. 6A and 6B are cross section and bottom view of an essential portion of a flying recording head according to a third embodiment of the invention. The flying recording head 1 of the third embodiment includes the substrate 3 made of sapphire, the semiconductor laser oscillation region 2 formed by growing a crystal on the top surface 3c of the substrate 3, the light output surface 4 of the semiconductor laser oscillation region 2, and the slider surface 6 formed in the under surface of the substrate 3.

The semiconductor laser oscillation region 2 has: the active layer 21 parallel to the recording medium 7a of the optical disk 7; a reflection protective film 29e formed after one end of the active layer 21 is ground at an angle of 45 degrees, for bending a laser beam by 90 degrees; the reflective light shading body 11 having the aperture 10 formed at the destination of a laser beam 2a reflected by the reflection protective film 29e; and the dielectric multilayer film 29b having a high reflectance formed on the front end surface 3b of the substrate 3, which forms a resonator for laser with the reflective light shading body 11 via the reflection protective film 29e.

According to the third embodiment above, the slider surface 6 is formed on the back surface side of the semiconductor laser oscillation region 2 of the substrate 3, and a cleavage plane is not used as the slider surface 6. Consequently, the slider surface 6 and the light shading body 11 can be formed on a wafer unit basis after growing the crystal of the semiconductor laser oscillation region 2. The process can be therefore simplified and the reliability can be improved. Since the process can be performed on the wafer unit basis, the photolithography process can be used, and higher precision and lower price can be realized. The process can be performed before growing the crystal, thereby enabling the process after growth of the crystal to be reduced. Consequently, the reliability can be further improved.

In the embodiment as well, a conductive substrate made of GaN, SiN, or the like can be used. In this case, the cathode is formed in the recess 6d of the slider surface 6.

FIG. 7A is a cross section of an essential region of a flying recording head according to a fourth embodiment of the invention, FIG. 7B is a cross section taken along line A—A of FIG. 7A, FIG. 7C is a cross section taken along line B—B of FIG. 7B, and FIG. 7D is a diagram showing the light output surface 4 of the semiconductor laser oscillation region 2. According to the flying recording head 1 of the fourth embodiment, in a manner similar to the second embodiment, GaN having n-type conductivity is used for the substrate 3, and a ring laser is formed as shown in FIGS. 7B and 7C by using a crystal of AlGaInN on the substrate 3.

In the ring laser, a contact layer, a cladding layer, a guide layer, and the like are similar to those in the first embodiment. To form the ring laser, an oscillation region 21a, namely, the current narrowing layer 27 is formed in a rhombus as shown in FIG. 7B. The fourth embodiment is similar to the second embodiment except that each of the anodes 23a and 23b is formed in a rhombus shape so as to be adjusted to the shape of the oscillation region 21a, and that the dielectric multilayers 29a and 29b also serving as a protective film of the semiconductor crystal are formed on the surface opposite to the light output surface 4.

According to the fourth embodiment, since the refractive index of a GaN-based semiconductor is 2.5 or higher, the critical angle of total reflection becomes 23.5 degrees or less. As shown in FIG. 7B, when the oscillation region 21a is formed so as to reflect light symmetrically on each of the crystal interfaces, an average incident angle on each interface becomes 45 degrees, and the condition of the total reflection can be satisfied in all of the surfaces. Thus, a resonator for laser with little light loss can be formed.

By providing the light shading body 11 having the aperture 10 on the light output surface 4 of the ring laser, the wave front of the laser beam in the laser is converted in this region, and the resultant is emitted as propagation light to the outside or seeps as near-field light through the aperture 10. In a manner similar to the second embodiment, by soaking the recording medium 7a with the seeped light 8, information can be recorded.

All the shapes shown in the first embodiment can be used as the shape of the aperture 10, and similar effects can be obtained. Since light is total-reflected by the light output surface 4 except for the aperture, the light shading body 11 is not always necessary. Only by the micro-metal body 11a, the laser beam on the inside can be scattered, and information can be recorded by using the scattered light.

Further, in the ring laser, a laser beam does not return on the same path. An effective length of the resonator is twice as long as or longer than that of an edge emitting type laser, so that the length of the laser can be shortened to the half or less, for example, 150 μm or less. A target height of the magnetic head is, in a femto slider, about 200 μm. Such a size is required also in a head for optical recording. According to the embodiment, the size is satisfied.

Figure 8A:
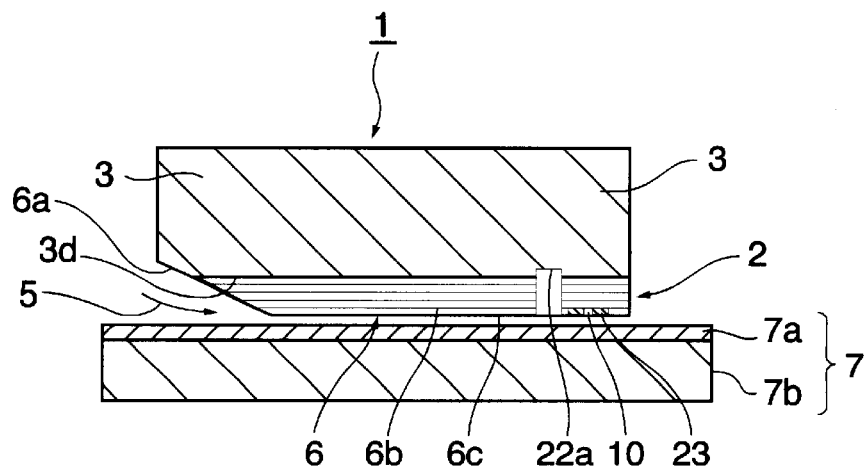
FIGS. 8A and 8B are cross section and bottom view of an essential portion of a flying recording head according to a fifth embodiment of the invention.
Figure 8B:
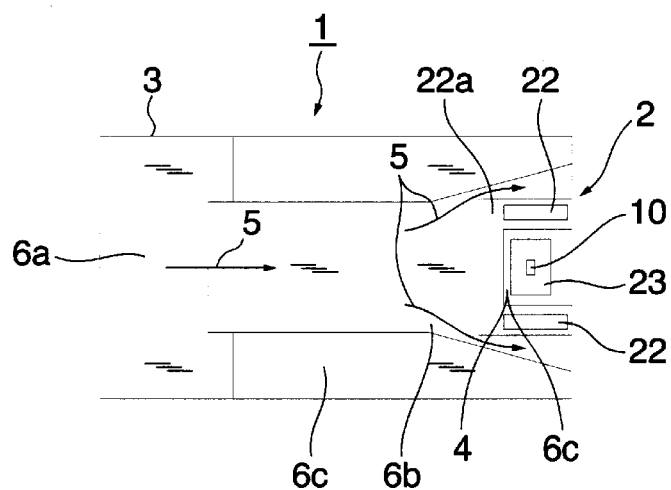
Figure 8C:
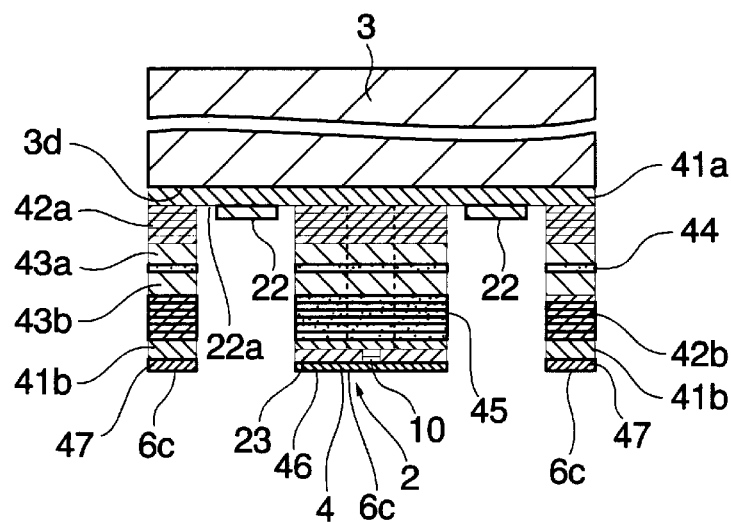
FIG. 8C is a cross section of a semiconductor laser oscillation region.

FIGS. 8A and 8B are cross section and bottom view, respectively, of an essential portion of a flying recording head according to a fifth embodiment of the invention. FIG. 8C is a cross section of the semiconductor laser oscillator region 2. As the semiconductor laser oscillation region 2 in the fifth embodiment, a vertical cavity surface emission laser (VCSEL) 3 is used. In order to make the light output surface 4 close to the recording medium 7a of the optical disk 7, the slider surface 6 is provided around the light output surface 4. The structure of the slider surface 6 except for the semiconductor laser oscillation region 2 is similar to that in each of the first and second embodiments as shown in FIG. 8B and similar effects can be obtained.

As shown in FIG. 8C, the semiconductor laser oscillation region 2 has a stack structure of an AlGaInN-based semiconductor for emitting blue light (having a wavelength of 400 nm) on the under surface 3d of the substrate 3 made of sapphire. Specifically, the semiconductor laser oscillation region 2 has the substrate 3, and the following layers staked on the under surface 3d of the substrate 3 via a GaN buffer layer (not shown), which are an n-type GaN contact layer 41a, an n-type GaN/AlGaN reflection multilayer 42a, an n-type GaN spacer layer 43a, an InGaN active layer 44, a p-type GaN spacer layer 43b, a p-type InGaN current narrowing layer 45, a p-type GaN/AlGaN reflection multilayer 42b, a p-type GaN contact layer 41b, and Pt/Ti/Au. The semiconductor laser oscillation region 2 further has the anode 23 also serving as a light shading body and having the aperture 10 provided so as to be buried in the contact layer 41b, an SiN protective film 46 for protecting the anode 23, a slide layer 47 taking the form of a GaN growth layer formed on the p-type GaN contact layer 41b, the cathode contact surface 22a formed by etching, and the cathode 22 formed on the surface of the contact surface 22a. The surface of the slide layer 47 and that of the SiN protective layer 46 serve as the projections 6c forming the slider surface.

According to such a fifth embodiment, the aperture 10 of the light output portion in the semiconductor laser oscillation region 2 can be formed almost flush with the slider surface 6, so that small recording marks can be formed on the recording medium 7a in a manner similar to the first embodiment.

The light shading body may be separately formed on the inside of the anode 23. By this arrangement, a material of the light shading body can be selected arbitrarily, and the light shading body can be formed by a single metal layer. Consequently, the processing accuracy of the aperture 10 can be raised. By providing a phase adjusting layer (not shown) between the reflection multilayer 42b and the light shading body 11, and by adjusting the phase of a reflection ray in the reflection multilayer film 42b and that of the light shading body 11, the reflectance of synthetic light of the reflection rays may be raised.

The slider layer 46 may be formed together with the protective film 45 by using an SiN sputtering layer after the electrode 23 is formed. The material is not limited to SiN. As long as a film is hard, a dielectric film made of $SiO_2$, $TiO_2$, or the like may be used.

Figure 9A:
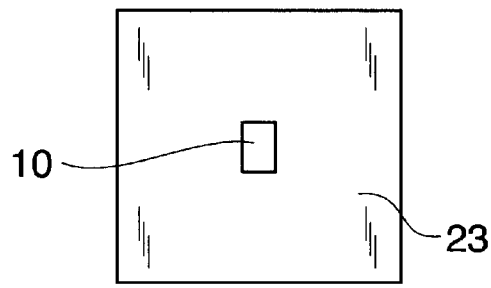
FIGS. 9A to 9C are diagrams showing modifications of the flying recording head according to the fifth embodiment.
Figure 9B:
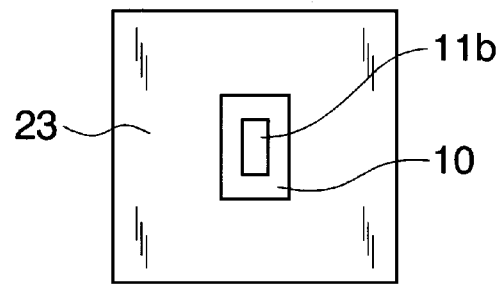
Figure 9C:
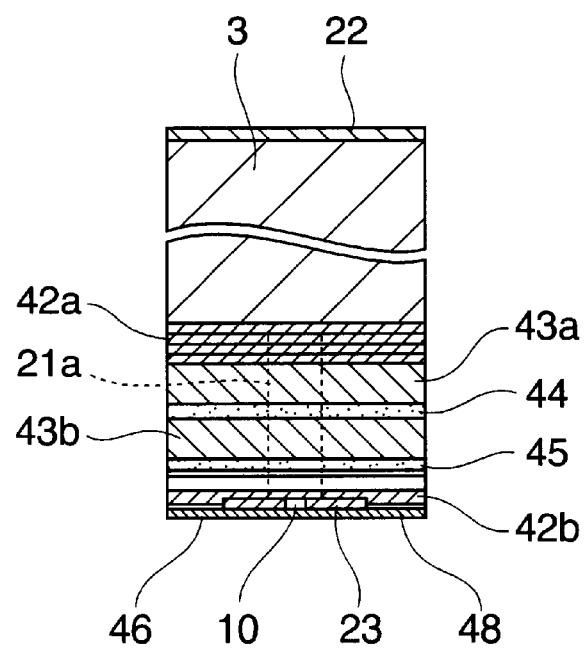

FIGS. 9A, 9B, and 9C show modifications of the fifth embodiment. As shown in FIGS. 9A and 9B, the aperture 10 can use shapes similar to those of the first embodiment, such as a rectangle and a coaxial shape having therein the micro-metal body 11b, and effects similar to those of the first embodiment are produced. The substrate 3 may be made of GaN having conductivity. By using the conductive substrate 3, the cathode 22 can be formed on the back surface of the substrate 3. As shown in FIG. 9C, consequently, etching for forming the contact becomes unnecessary, and the process can be simplified.

Figure 10A:
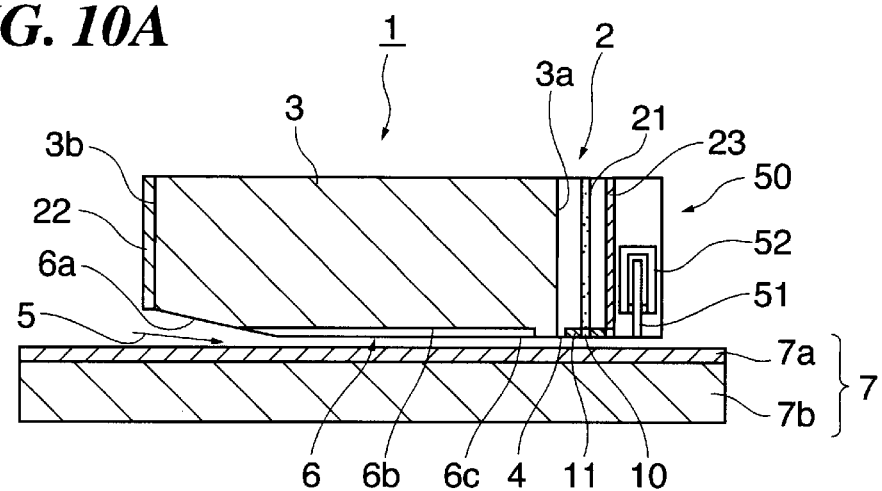
FIGS. 10A, 10B, and 10D are cross section, rear end view, and bottom view, respectively, of an essential portion of a flying recording head according to a sixth embodiment of the invention.
Figure 10B:
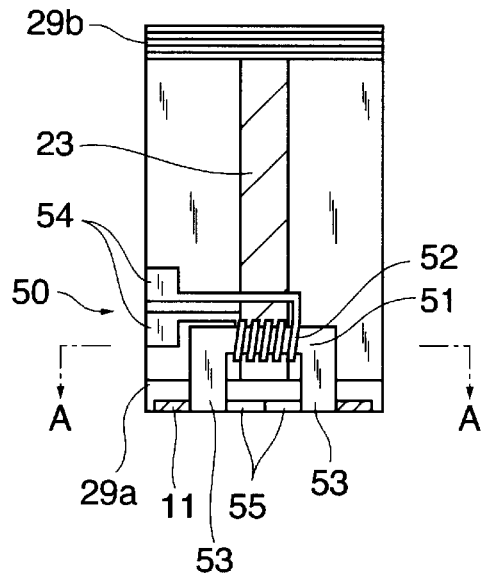
Figure 10C:
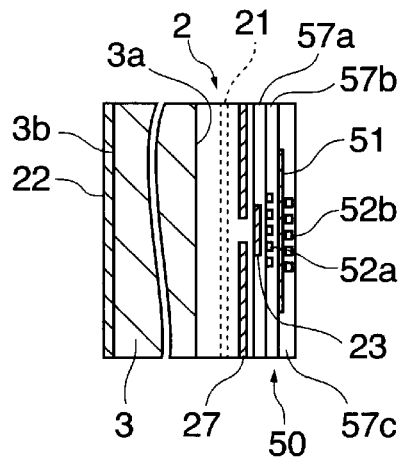
FIG. 10C is a cross section taken along line A—A of FIG. 10B.
Figure 10D:
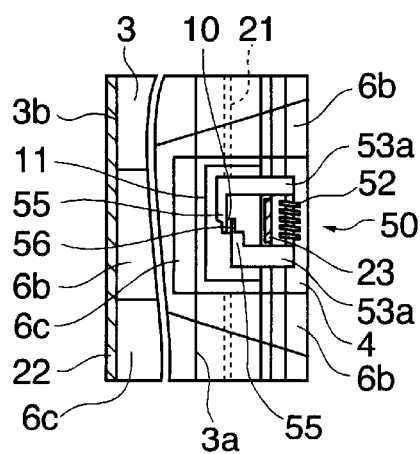

FIGS. 10A to 10D show a flying recording head according to a sixth embodiment of the invention. FIG. 10A is a cross section of an essential portion of the head, FIG. 10B is a rear end view, FIG. 10C is a cross section taken along line A—A of FIG. 10B, and FIG. 10D is a bottom view. In the flying recording head according to the sixth embodiment, as shown in FIG. 10A, in a manner similar to the second embodiment, the semiconductor laser oscillation region 2 including the light shading body 11 having the aperture 10 is integrated to the rear end surface 3a of the substrate 3 made of conductive GaN, further, a thin film magnetic transducer 50 is integrated to the semiconductor laser oscillation region 2, and the slider surface 6 is formed in the bottom surface, thereby enabling the head to travel over the recording medium 7a on the optical disk 7 so to make the laser beam and the magnetic gap close to each other. In such a manner, optically assisted magnetic recording to a magnetic recording film or a magnetooptic recording film is realized.

The thin film magnetic transducer 50 includes a magnetic circuit and a coil portion. The magnetic circuit includes a magnetic core 51 made of a soft magnetic material such as Permalloy, a yoke 53, a yoke extended portion 53a coupled to the yoke 53, and a pair of magnetic poles 55 forming a magnetic gap 56. The coil portion is made by a Cu thin film and is constructed by a magnetic coil 52 wound cylindrically around the magnetic core 51, and pads 54 provided at the tips of the magnetic coil 52. The coil portion is disposed on the top surface of the semiconductor laser oscillation region 2. The yoke extended portion 53a, magnetic poles 55, and magnetic gap 56 are formed on the light output surface 4 of the semiconductor laser 2.

Figure 11A:
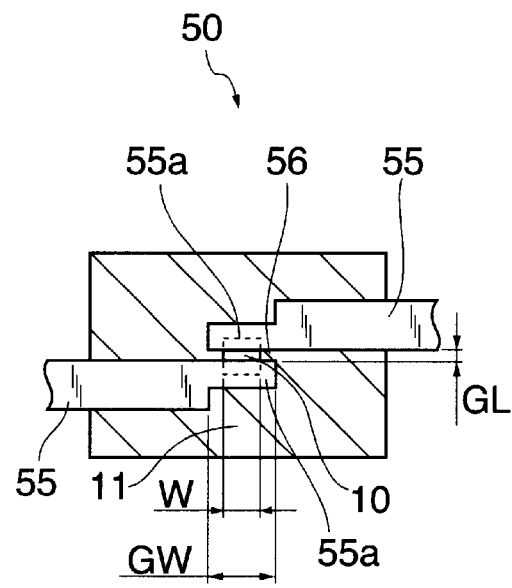
FIG. 11A is a diagram showing the relation between an aperture and a magnetic gap in the sixth embodiment.

FIG. 11A shows the relation between the aperture 10 and the gap 56 in the sixth embodiment. FIG. 11A shows an example where the width W of the aperture 10 is made narrower than the length GW (hereinbelow, called "gap width") of a magnetic pole tip 55a. A temperature increasing portion of the magnetic recording medium can be therefore made narrower than the gap width GW. From the magnetic pole tip 55a, a magnetic field usually extends to the peripheral portion, and due to a leakage magnetic field, the recording width is suppressed, and it is difficult to narrow the recording track width. According to the example, the recording width can be suppressed by the laser beam determined by the size of the aperture 10, so that recording of higher density can be realized.

An example of the method of fabricating the thin film magnetic transducer 50 will now be described. The magnetic core 51, magnetic coil 52, and yoke 53 of the thin film magnetic transducer 50 are fabricated by using a thin film process. Specifically, first, the anode 23 of the semiconductor laser is buried and planarized by an $SiO_2$ film 57a and, after that, a lower coil 52a is formed by sputtering and patterning. Further, an upper coil 52b and the magnetic core 51 and the yoke 53 made of Permalloy are repeatedly buried and planarized by $SiO_2$ films 57b and 57c by sputtering and patterning, thereby completing the thin film magnetic transducer 50. The yoke extended portion 53b in the light output surface and the magnetic poles are also made of Permalloy and are formed so as to be buried in the dielectric multilayer film 29a. The periphery is covered with the light shading body 11, and a rectangular-shaped substantial aperture for emitting a laser beam is formed by using the magnetic gap 56 and the light shading body 11 having the aperture 10.

The operation of the sixth embodiment will now be described. What is called optically assisted magnetic recording of decreasing the coercive force of the magnetic recording medium 7a by an increase in temperature by irradiating a recording mark forming portion in the magnetic recording medium 7a on the optical disk 7 with the laser beam 8 to record information by a modulated magnetic field is performed. A signal is reproduced by using the thin film magnetic transducer 50 used for recording. Specifically, a signal is reproduced by converting a change in magnetic flux incident on the magnetic pole 55 when the magnetic gap 56 passes through a leakage magnetic field from the magnetic recording medium 7a into a current by the coil 52.

The sixth embodiment is effective, particularly, on reproduction by a ferrimagnetic material such as TbFeCo adjusted so that a compensation temperature can be around room temperature. To be specific, since such a medium has weak magnetization at room temperature, a leakage magnetic field is small. Consequently, the magnetization has to be increased by heating. In the embodiment, the temperature of the reproducing portion in the recording medium below the magnetic gap 56 can be increased by heating, so that signal intensity can be increased by one digit or more.

The size of the thin film magnetic transducer 50 is substantially the same as that of the semiconductor laser. Thus, a very small flying recording head can be provided.

By aligning the aperture 10 and the magnetic gap 56, the recording area can be limited. A smaller recording mark can be formed as compared with the case of using either the aperture 10 or the magnetic gap 56, so that higher recording density can be achieved. By aligning the aperture 10 and the magnetic gap 56, only the portion where the magnetic field in the vertical direction exists can be recorded. Therefore, a magnetooptic head adapted to recording information to a vertical magnetic medium can be formed.

At the time of reproduction as well, a recording mark can be irradiated with a laser beam. It is, therefore, also possible to increase reproducibility by a rise in temperature by using a film made of TeFeCo or the like of which magnetization is weak and increases by the rise in temperature.

The flying recording head which can perform optically assisted magnetic recording can be fabricated only by combining the conventional semiconductor laser fabricating process and magnetic head fabricating process. Thus, a cheap flying recording head of high mass-productivity can be provided.

Figure 11B:
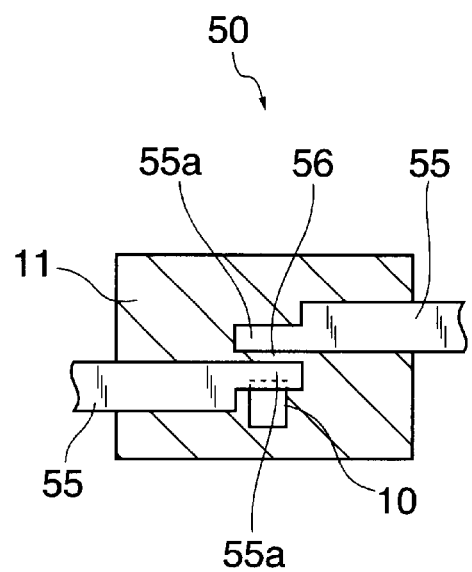
FIGS. 11B to 11D are diagrams showing modifications of a flying recording head according to the sixth embodiment.
Figure 11C:
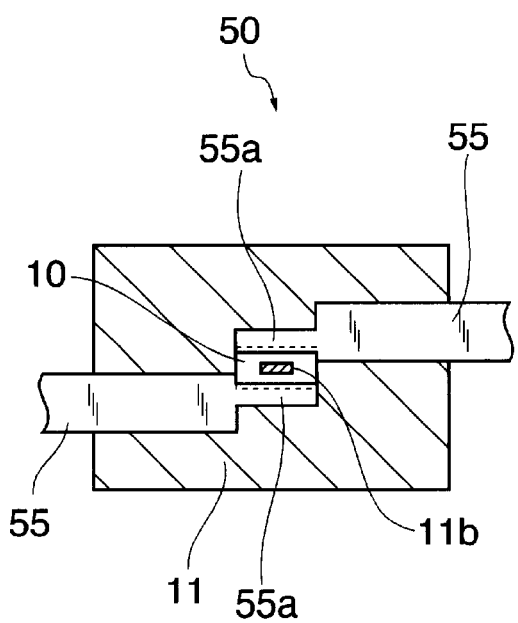
Figure 11D:
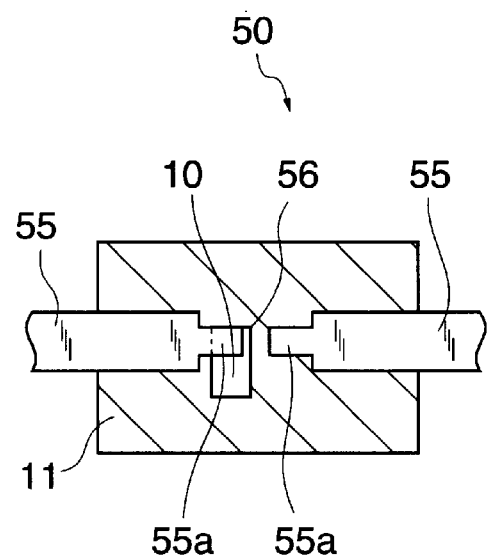

FIGS. 11B to 11D show modifications of the aperture 10 and the magnetic gap 56. FIG. 11B shows that the aperture 10 is formed in a position preceding to the magnetic gap 56 at the time of recording. In this case as well, the recording mark length is determined by the magnetic gap length GL, and the mark width is determined by the width W of the aperture 10, the gap width GW may be longer than the gap length GL, and the length of the aperture 10 may be longer than the width W. Consequently, the required processing precision of each of the aperture 10 and the magnetic gap 56 is lessened. Since a relatively large aperture 10 can be used, the laser beam use efficiency is excellent, and a laser of low power can be used.

FIG. 11C shows an example in which the micro-metal body 11b smaller than the aperture 10 is formed in the aperture 10. By forming the aperture 10 coaxially with the micro-metal body 11b, even when the size of the aperture 10 is as small as one tenth of the wavelength of a laser beam, propagation light can be emitted, and the intensity of the laser beam can be increased. By the micro-metal body 11b in the center, near-field light can be scattered, and near-field light emitted from the plasmon excited in the micro-metal body 11b can be used to increase the temperature of the recording medium. Further, a laser beam of higher intensity can be used.

FIG. 11D shows a case where the aperture 10 is formed near one of the pair of magnetic pole tips 55a and 55a to increase the temperature of only a portion near the magnetic pole tip 55a in a magnetic recording medium, thereby suppressing a rise in temperature around the other magnetic pole tip 55a as much as possible. The magnetic field in the direction perpendicular (perpendicular to the drawing sheet) to the gap below the magnetic gap 56 becomes the maximum at each of the magnetic pole tip 55a, and the magnetic field directions at the magnetic pole tips 55a are opposite to each other. By the configuration, therefore, only a part of the recording medium on which the magnetic field of one of the directions falls can be heated, optically assisted magnetic recording can be performed in a small area and, further, high recording density can be realized. In the configuration, since only the portion in which the magnetic field is perpendicular to the recording medium is used, a single magnetic pole is substantially formed. Particularly, the configuration is adapted to recording on a vertical magnetic recording medium, and recording of information to a small area by the vertical magnetic recording can be realized.

Figure 12A:
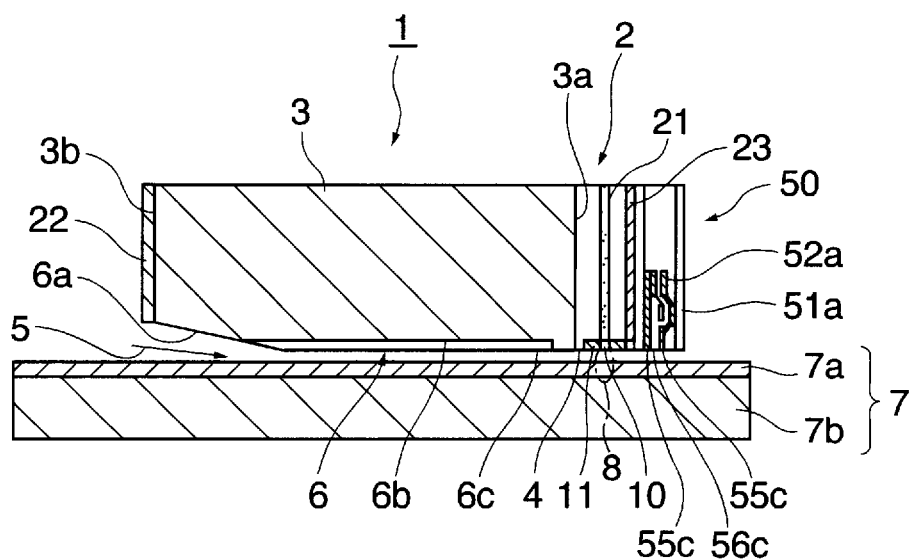
FIGS. 12A, 12B, and 12C are cross section, rear end view, and bottom view, respectively, of an essential portion of a flying recording head according to a seventh embodiment of the invention.
Figure 12B:
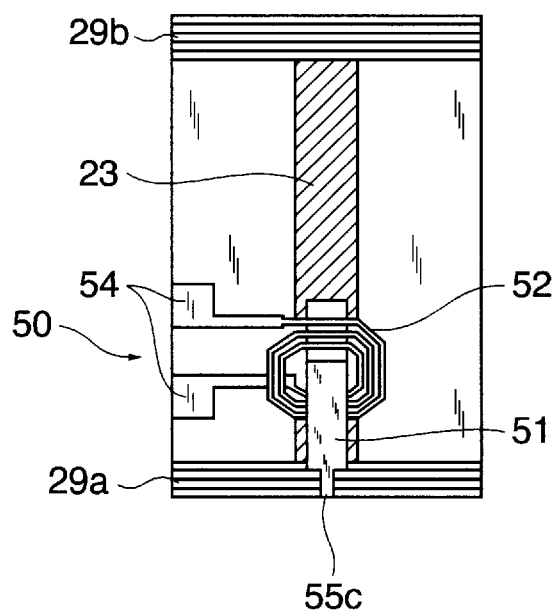
Figure 12C:
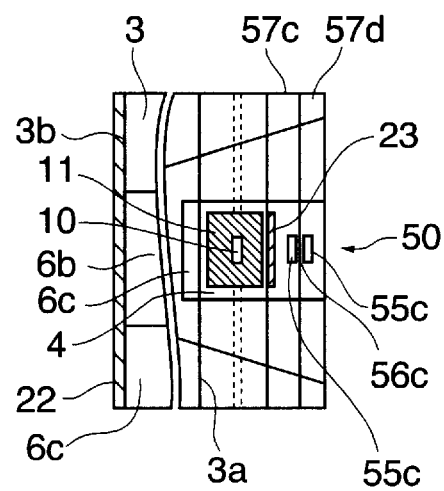

FIGS. 12A, 12B, and 12C are cross section, rear end view, and bottom view of an essential portion of a flying recording head according to a seventh embodiment of the invention. The flying recording head 1 of the seventh embodiment is similar to the sixth embodiment with respect to the points that the semiconductor laser oscillation region 2 is integrated to the rear end surface 3a of the substrate 3, the thin film magnetic transducer 50 is integrated to the semiconductor laser oscillation region 2, and the head 1 has the slider surface 6, but is different from the sixth embodiment with respect to the point that a transducer 50 used for a conventional magnetic head is used as the thin film magnetic transducer 50.

In the thin film magnetic transducer 50, as shown in FIGS. 12A and 12B, the magnetic coil 52 is wound around the magnetic core 51a in a disc shape, and the magnetic gap 56c is formed between the magnetic pole tips 55c.

According to such a seventh embodiment, the magnetic gap of the thin film magnetic transducer 50 is formed on an end surface side as shown in FIG. 12A. As understood from FIG. 12C, therefore, the magnetic gap cannot be formed in the same position as that of the aperture 10 as a laser beam output region and is apart from the aperture 10 by almost 2 μm. Since the laser beam 8 precedes the magnetic gap 56c and the distance between them is short, after heating by the laser beam irradiation, information can be recorded before the heated portion gets cold. Also by using the flying recording head of this structure, optically assisted magnetic recording can be performed. Effects similar to those of the sixth embodiment can be obtained. Since the thin film magnetic transducer 50 of the structure similar to that of a conventional magnetic head is used in the embodiment, a flying recording head can be fabricated by using an established process technique. A cheap, very-reliable flying recording head can be therefore provided.

Figure 13A:
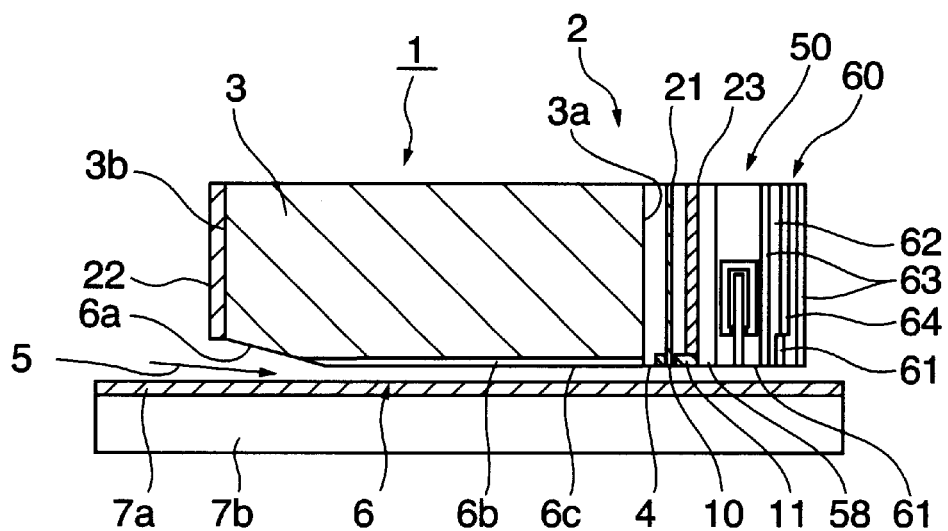
FIGS. 13A and 13B are cross section and bottom view, respectively, of an essential portion of a flying recording head according to an eighth embodiment of the invention.
Figure 13B:
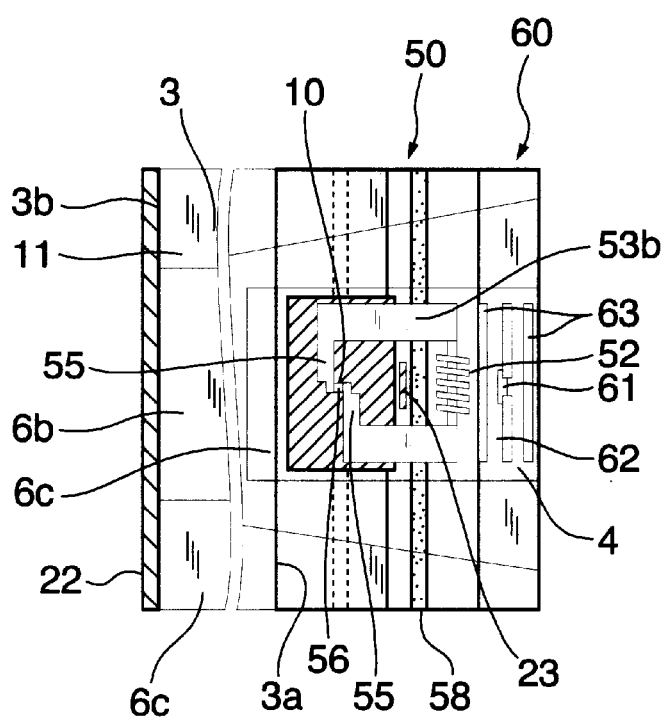

FIGS. 13A and 13B are cross section and bottom view of an essential portion of a flying recording head according to an eighth embodiment of the invention. In the flying recording head 1 of the eighth embodiment, as shown in FIG. 13A, a magnetic sensor 60 which takes the form of a GMR sensor is integrated to the thin film magnetic transducer 50 in the flying recording head 1 of the sixth embodiment, thereby enabling optically assisted magnetic recording to be performed onto a magnetic recording film and a magnetooptic recording film, and enabling signal reproduction by the magnetic sensor 60 to be realized.

The magnetic sensor 60 is constructed by a spin valve film 61 and an electrode 64 which are sandwiched by two magnetic shielding layers 63 which are soft magnetic films via an insulating layer 62. The magnetic sensor 60 detects a change in resistance of the spin valve film 60 caused by a change in the magnetic field entering from a recording medium.

The seventh embodiment is similar to the sixth embodiment except that the magnetic sensor 60 is formed. According to the seventh embodiment, similar effects are obtained and, moreover, signal reproduction of high sensitivity by the magnetic sensor 60 can be realized. In the seventh embodiment, the magnetic sensor 60 is formed on the thin film magnetic transducer 50 to prevent the influence of the heat generated by the semiconductor laser oscillation region 2 from exerting onto the magnetic sensor 60. The structure is different from that of a conventional head in which the transducer is formed on the magnetic sensor.

Although the thin film magnetic transducer 50 similar to that in the sixth embodiment is used, the invention is not limited to it but can use a transducer similar to that in the seventh embodiment, and similar effects can be obtained. The semiconductor laser oscillation region 2 as shown in each of the first to third embodiments can also be used, and similar effects can be obtained.

Figure 14A:
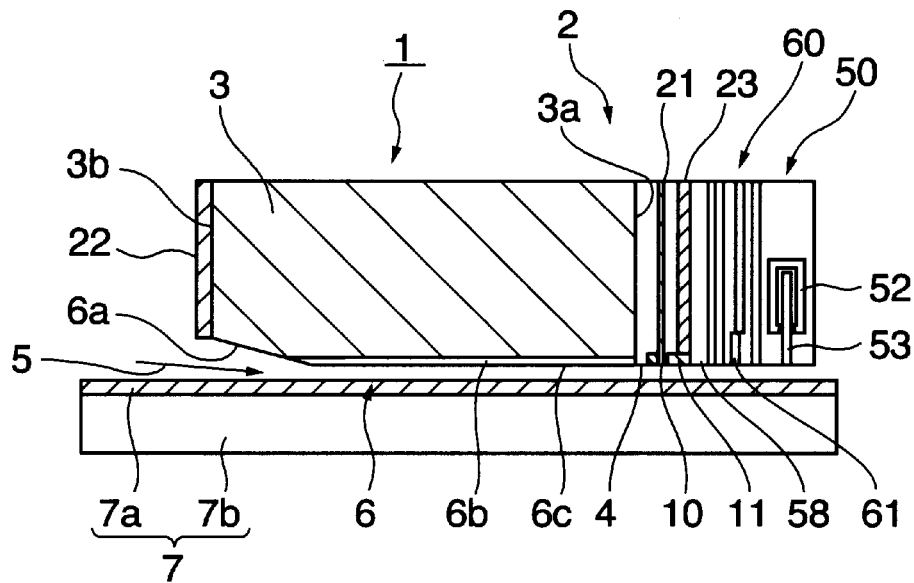
FIGS. 14A and 14B are cross section and bottom view, respectively, of an essential portion of a flying recording head according to a ninth embodiment of the invention.
Figure 14B:
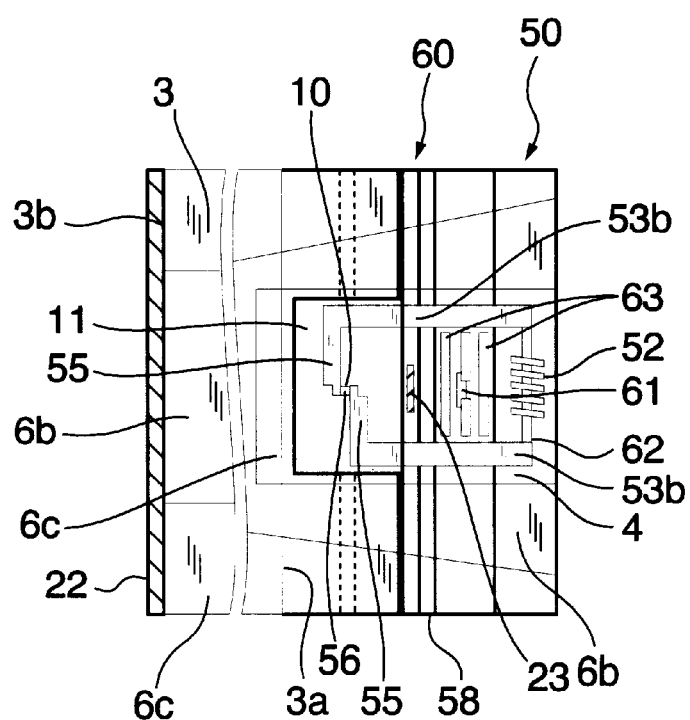

FIGS. 14A and 14B are cross section and bottom view, respectively, of an essential portion of a flying recording head according to the ninth embodiment of the invention. As shown in FIG. 14A, in the flying recording head 1 of the ninth embodiment, the GMR sensor 60 and the thin film magnetic transducer 50 are sequentially stacked on the semiconductor laser oscillation region 2 of the flying recording head 1 of the second embodiment via a thermal insulating film 58 made of polimide. The ninth embodiment is similar to the eighth embodiment except that the position of the GMR sensor 60 and that of the thin film magnetic transducer 50 are opposite to those of the eighth embodiment. Consequently, since the order of forming the GMR sensor 60 and the thin film magnetic transducer 50 is similar to that of the conventional magnetic head, a very reliable, established fabricating process can be used as it is, and a cheap, very reliable flying recording head can be provided.

Figure 15:
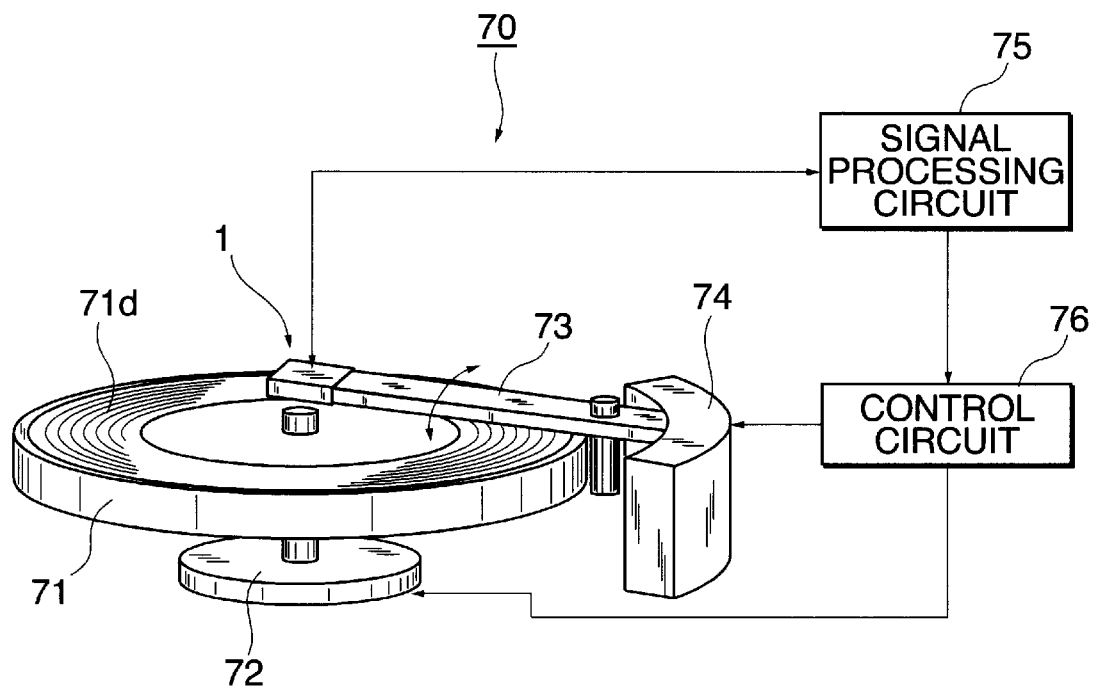
FIG. 15 is a perspective view of a disk drive according to a tenth embodiment of the invention.
Figure 16:
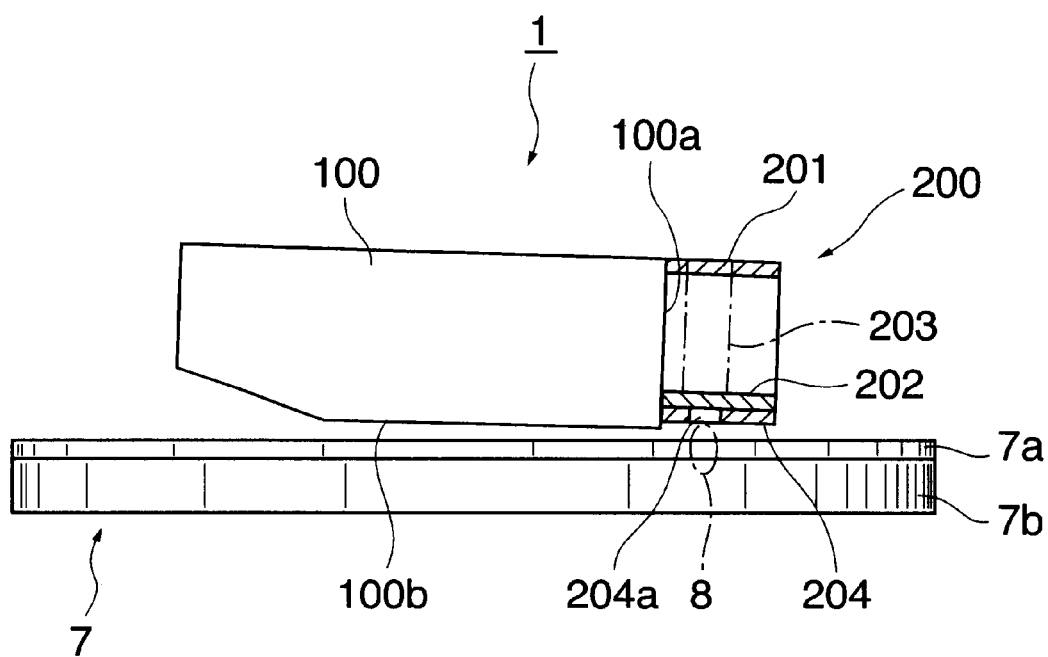
FIG. 16 is a diagram showing a conventional flying recording head.

FIG. 15 shows a disk drive according to a tenth embodiment of the invention. A disk drive 70 of the tenth embodiment includes an optical disk 71 using a phase change medium made of GeSbTe as a recording medium 71a, a motor 72 for rotating the optical disk 71, a swing arm 73 on which the flying recording head 1 of the first embodiment is mounted and which travels above the recording medium 71a of the optical disk 71, a linear motor 74 for operating the swing arm 73, a signal processing circuit 75 for sending a record signal to the flying recording head 1 and processing a reproduction signal from the flying recording head 1, and a control circuit 76 for controlling the motor 72 and the linear motor 74.

The operation of the disk drive 70 will now be described. At the time of recording, the signal processing circuit 75 outputs a record signal to the flying recording head 1 to modulate the laser beam 8 emitted from the semiconductor laser oscillation region 2. The modulated laser beam 8 is emitted to recording tracks (not shown) of the recording medium 71a, thereby performing thermal recording. At the time of reproduction, a signal is reproduced by using what is called a self coupling effect of the semiconductor laser. Specifically, a relatively weak continuous laser beam 8 is emitted from the semiconductor laser oscillation region 2, so that the recording tracks (not shown) on which information is recorded are continuously irradiated with the laser beam 8. In the case of the recording medium 71a using a phase change medium, information is recorded by detecting a change in reflectance, and the intensity of reflected light of the laser beam 8 is modulated on the basis of the recording. The modulated reflected light is allowed to reenter the semiconductor laser oscillation region 2 through the aperture in the semiconductor laser oscillation region 2, and a change in impedance of the semiconductor laser oscillation region 2 by the reentry is detected, thereby performing signal reproduction.

Tracking at the time of recording and reproduction is performed by using what is called sample servo method. Specifically, a staggered mark line for tracking in which marks are deviated from each other in the lateral direction with respect to tracks is formed on the optical disk 71, the intensity of reflected light when the laser beam 8 falls on the staggered mark line is detected by using the self coupling effect of the semiconductor laser oscillation region 2, and a position error signal of a light spot is generated by the control circuit 76, thereby performing tracking.

According to such a disk drive 70 of the tenth embodiment, the optical disk 71 can be recorded/reproduced by using the flying recording head of about the same size as that of a magnetic head. The size of the laser beam is reduced by the aperture 10, thereby enabling a small recording mark to be formed. Consequently, high-speed, high-recording density optical recording can be realized. Since a flying recording head can be fabricated by using only the conventional semiconductor laser process and magnetic head, a cheap, very reliable disk drive can be provided.

Since the optical recording or optically assisted magnetic recording is conducted by using a laser beam passed through the micro-aperture, a small recording mark can be formed, and the recording/reproduction of high surface recording density and high transfer rate can be realized.

Since the flying recording head of the size as small as that used in a magnetic hard disk drive is used, a disk drive having not only the high surface recording density but also high volume density can be provided.

Since a small flying recording head can be fabricated, high-speed tracking can be realized.

Although the disk drive 70 in the embodiment uses the flying recording head of the first embodiment as the flying recording head 1, the invention is not limited to the flying recording head and, obviously, any of the flying recording heads of the other embodiments can be used, and effects similar to those of the tenth embodiment can be produced.

Although the disk drive 70 of the embodiment uses the optical disk 71 using a phase change medium made of GeSbTe as the recording medium 71a, the invention is not limited to the above. By using the flying recording head of any of the sixth to ninth embodiments, a medium for a magnetooptic disk made of TeFeCo or the like or a magnetic recording medium made of CoCrTa or the like can be used as a recording medium for an optical disk, and recording and reproduction of information can be realized.

In the embodiment, for the recording, optical heating can be used. Consequently, the magnetic or magnetooptic recording medium can be heated close to the Curie temperature. Information can be recorded in a state where the coercive force is decreased. A recording medium having high coercive force can be therefore used at room temperature, and the stability of recording can be increased.

In the case of using the flying recording head according to any of the sixth to ninth embodiments, a tracking error signal can be generated by not only a laser beam but also magnetically by using the thin film magnetic transducer 50 or magnetic sensor 60.

In the case of using the flying recording head 1 of the sixth or seventh embodiment, reproduction is performed by using the thin film magnetic transducer 50. TeFeCo of ferrimagnetic material of which intensity of magnetization increases by light heating is suitable for a recording medium. By performing reproduction using light heating, the intensity of a reproduction signal can be largely increased.

In the case of using the flying recording head 1 of the eighth or ninth embodiment, a magnetic sensor such as a GMR sensor which is not highly resistive to heat is used. Consequently, at the time of recording, LP-MFM (Laser-Pulsed Magnetic Field Modulation) which is a method of modulating a magnetic field on the basis of an information signal and emitting pulses as the laser beam 8 synchronously with the modulation is suitable since there is not much of a thermal load.

As described above, according to the invention, the substrate, semiconductor laser, and slider surface are integrated. Consequently, the flying recording head can be formed in small size with high mass-productivity and high precision, thereby enabling higher recording density and higher transfer rate to be achieved at low cost.

The entire disclosure of Japanese Patent Application No. 2000-136905 filed on May 10, 2000 including specification, claims, drawings and abstract is incorporated herein by reference in its entirety.

What is claimed is:

1. A flying recording head which flies on an airflow generated by rotation of a disk, comprising:

a substrate;

a semiconductor laser formed by growing a semiconductor crystal on the substrate; and a slider surface formed on a surface of at least one of the substrate and the semiconductor laser facing the disk.

2. The flying recording head according to claim 1, wherein the semiconductor laser has a light shading body having an aperture of a size smaller than that of a laser beam at a laser beam output region.

3. The flying recording head according to claim 2, wherein the light shading body has a small metal body on the inside of the aperture.

4. The flying recording head according to claim 2, wherein the aperture is filled with a semiconductor crystal or dielectric material.

5. The flying recording head according to claim 1, wherein the semiconductor laser is an edge emitting type semiconductor laser or a surface emitting type semiconductor laser.

6. A flying recording head which flies on an airflow generated by rotation of a disk, comprising:

a substrate;

a semiconductor laser formed by growing a semiconductor crystal on a downstream side surface of the airflow of the substrate; and a slider surface formed on a surface of at least one of the substrate and the semiconductor laser facing the disk.

7. The flying recording head according to claim 6, wherein the semiconductor laser has a thin film magnetic transducer on the downstream side of the airflow.

8. The flying recording head according to claim 7, wherein the thin film magnetic transducer comprises a magnetic circuit having a magnetic gap and a coil wound around a magnet core constructing the magnetic circuit.

9. The flying recording head according to claim 8, wherein the magnetic gap is formed in or around a laser beam output region in an output surface of the semiconductor laser.

10. The flying recording head according to claim 8, wherein the semiconductor laser comprises a light shading body having an aperture of a size smaller than that of a laser beam in a laser beam output region, and the aperture is disposed on the upstream side of the airflow with respect to the magnetic gap.

11. The flying recording head according to claim 6, wherein the semiconductor laser comprises a light shading body having an aperture of a size smaller than that of a laser beam in a laser beam output region.

12. The flying recording head according to claim 6, wherein the semiconductor laser has a thin film magnetic transducer and a magnetic sensor on the downstream side of the airflow.

13. The flying recording head according to claim 12, wherein the thin film magnetic transducer is disposed on the upstream side of the airflow with respect to the magnetic sensor.

14. The flying recording head according to claim 13, wherein the thin film magnetic transducer has a thermal insulating layer between the thin film magnetic transducer and the semiconductor laser.

15. The flying recording head according to claim 12, wherein the magnetic sensor is disposed on the upstream side of the airflow with respect to the thin film magnetic transducer.

16. The flying recording head according to claim 15, wherein the magnetic sensor has a thermal insulating layer between the magnetic sensor and the semiconductor laser.

17. A flying recording head which flies on an airflow generated by rotation of a disk, comprising:
- a substrate;
- a surface emitting type semiconductor laser formed by growing a semiconductor crystal on a surface of the substrate facing the disk; and
- a slider surface formed on a surface of at least one of the substrate and the surface emitting type semiconductor laser facing the disk.

18. The flying recording head according to claim 17, wherein the surface emitting type semiconductor laser includes a dielectric multilayer as a component of a resonator and the surface facing the disk of the surface emitting type semiconductor laser is a surface of dielectric multilayer.

19. A flying recording head which flies by an airflow generated by rotation of a disk, comprising:
- a transparent substrate;
- a slider surface formed on a surface facing the disk of the substrate; and
- a semiconductor laser which is formed by growing a semiconductor crystal on a surface of the substrate opposite to the slider surface and emits a laser beam through the substrate.

20. The flying recording head according to claim 19, wherein the semiconductor laser comprises: an active layer which is formed in parallel to the slider surface; a dielectric multilayer provided at an upstream side of the airflow of the active layer; a reflective surface which is provided at a downstream side of the active layer of the airflow and reflects the laser beam generated in the active layer toward the disk; and a reflective light shading body which is provided on an output region of the laser beam reflected by the reflective surface of the semiconductor laser, which constructs a resonator together with the dielectric multilayer, and has an aperture of a size smaller than that of the laser beam.

21. The flying recording head according to claim 20, wherein the reflective light shading body is buried in the dielectric multilayer which constructs the resonator together with the reflective light shading body.

22. A disk drive comprising:
- a disk having a surface on which a recording medium is formed;
- a motor which rotates the disk;
- a flying recording head having a semiconductor laser formed by growing a semiconductor crystal on a substrate and a slider surface formed on a surface of at least one of the substrate and the semiconductor laser facing the disk; and
- a moving unit which relatively moves the flying recording head with respect to the disk.

23. A method of manufacturing a flying recording head, comprising the steps of:
- forming a semiconductor laser by growing a semiconductor crystal on a substrate; and
- forming a slider surface at least on one of the substrate and the semiconductor laser.

24. The method of manufacturing a flying recording head according to claim 23, wherein the semiconductor laser is a surface emitting type semiconductor laser and is formed by cleaving the substrate to form an output surface and forming an air bearing surface of the slider surface, which is in a plane flush with the slider surface in the substrate.

25. The method of manufacturing a flying recording head according to claim 23, wherein the semiconductor laser is a surface emitting type semiconductor laser and is formed by growing the semiconductor crystal on the substrate and forming a air bearing surface on the slider surface by using the semiconductor crystal grown in the peripheral area of a laser output surface.

26. A method of manufacturing plural flying recording heads each having a substrate, a semiconductor laser, and a slider surface, comprising the steps of:
- forming plural semiconductor lasers by growing a semiconductor crystal on the substrate;
- forming the slider surface at least on a surface of one of the substrate and the semiconductor laser; and
- dicing the substrate.

* * * * *